United States Patent
Zhou et al.

(10) Patent No.: US 12,386,465 B1
(45) Date of Patent: Aug. 12, 2025

(54) TOUCH DETECTION CIRCUIT, TOUCH SENSING CHIP AND ELECTRONIC DEVICE

(71) Applicant: SILEAD INC., Shanghai (CN)

(72) Inventors: Jinling Zhou, Shanghai (CN); Hongzhen Chen, Shanghai (CN)

(73) Assignee: SILEAD INC., Shanghai (CN)

( * ) Notice: Subject to any disclaimer, the term of this patent is extended or adjusted under 35 U.S.C. 154(b) by 0 days.

(21) Appl. No.: 18/746,701

(22) Filed: Jun. 18, 2024

(30) Foreign Application Priority Data

Jul. 6, 2023 (CN) .......................... 202310828486.7

(51) Int. Cl.
| | |
|---|---|
| G06F 3/044 | (2006.01) |
| H03K 17/96 | (2006.01) |
| H03K 19/20 | (2006.01) |
| H03M 1/12 | (2006.01) |
| H03M 1/66 | (2006.01) |

(52) U.S. Cl.
CPC ............ G06F 3/044 (2013.01); H03K 17/962 (2013.01); H03K 19/20 (2013.01); H03M 1/12 (2013.01); H03M 1/66 (2013.01)

(58) Field of Classification Search
CPC ...... G06F 3/044; H03K 17/962; H03K 19/20; H03M 1/12; H03M 1/66
See application file for complete search history.

(56) References Cited

U.S. PATENT DOCUMENTS

| | | | | |
|---|---|---|---|---|
| 2014/0146002 | A1* | 5/2014 | Mo ...................... | G06F 3/04164 345/174 |
| 2015/0338952 | A1* | 11/2015 | Shahparnia ........... | G06F 3/0443 345/174 |
| 2018/0232635 | A1* | 8/2018 | Oh ........................... | G06F 5/01 |
| 2019/0272056 | A1* | 9/2019 | Wang ................. | G01R 27/2605 |

* cited by examiner

*Primary Examiner* — Amit Chatly
(74) *Attorney, Agent, or Firm* — ZIEGLER IP LAW GROUP

(57) ABSTRACT

A touch detection circuit, a touch sensing chip and an electronic device are disclosed. The touch detection circuit includes charge/discharge circuits, which are configured to charge or discharge the sense channels during scanning periods to convert sense signals on the sense channels into sense voltages; a reference voltage generator circuit, which is coupled to the sense channels of the touch screen and is configured to produce a reference voltage related to the voltages on the sense channels; programmable gain amplifiers including first input terminals coupled to output terminals of the charge/discharge circuits and second input terminals coupled to an output terminal of the reference voltage generator circuit, the programmable gain amplifiers configured to amplify differences between the sense voltages and the reference voltage; analog-to-digital converters, which are coupled to the programmable gain amplifiers and are configured for quantization of the differences that have been amplified by the programmable gain amplifiers.

15 Claims, 8 Drawing Sheets

TOUCH DETECTION CIRCUIT, TOUCH SENSING CHIP AND ELECTRONIC DEVICE

CROSS-REFERENCES TO RELATED APPLICATION

This application claims the priority of Chinese patent application number 202310828486.7, filed on Jul. 6, 2023, the entire contents of which are incorporated herein by reference.

TECHNICAL FIELD

The present disclosure relates to the field of touch sensing and, in particular, to a touch detection circuit, a touch sensing chip and an electronic device.

BACKGROUND

Currently, capacitive touch screens, which typically rely on capacitive sensors for touch detection, are widely used in various electronic devices. When a conductor such as a finger, nail, pen or something else is touching or approaching such a touch screen, a touch event takes place, which causes a change in capacitance around the location where the event occurs. Detecting an amount of the capacitance change allows for determining the location of the touch event and the user's associated touch operation.

SUMMARY OF THE INVENTION

The present disclosure provides a touch detection circuit including: charge/discharge circuits, which are coupled to respective sense channels of a touch screen and are configured to charge or discharge the sense channels during scanning periods to convert sense signals on the sense channels into sense voltages; a reference voltage generator circuit, which is coupled to the sense channels of the touch screen and is configured to produce a reference voltage related to the voltages on one or more of the plurality of sense channels; programmable gain amplifiers including first input terminals coupled to output terminals of the charge/discharge circuits and second input terminals coupled to an output terminal of the reference voltage generator circuit, the programmable gain amplifiers configured to amplify differences between the sense voltages and the reference voltage; and analog-to-digital converters, which are coupled to the programmable gain amplifiers and are configured for quantization of the differences that have been amplified by the programmable gain amplifiers.

Optionally, the reference voltage generator circuit may include an operational amplifier with a first input terminal and a plurality of second input terminals, each of the second input terminals coupled to a respective one of the sense channels, the first input terminal coupled to an output terminal of the operational amplifier, the operational amplifier configured to output an average of the voltages on the sense channels as the reference voltage.

Optionally, there may be n sense channels, where n is an integer satisfying n≥2, wherein the operational amplifier includes one first input transistor, n identical second input transistors and an operational amplifier circuit, a gate of the first input transistor coupled to an output terminal of the operational amplifier circuit, a drain of the first input transistor coupled to a first input terminal of the operational amplifier circuit, a source of the first input transistor and sources of the n second input transistors all coupled to a first current source, drains of the n second input transistors all coupled to a second input terminal of the operational amplifier circuit, gates of the n second input transistors coupled to the respective n sense channels.

Optionally, each charge/discharge circuit may include a charge/discharge branch including a first switch, a second switch and a second current source, the first switch including a control terminal at which a first control signal is received, the second switch including a control terminal at which a second control signal different from the first control signal is received, wherein: in a mutual capacitance scan mode, a terminal of the second current source is coupled to a first power supply voltage, another terminal of the second current source is coupled to a terminal of the second switch, another terminal of the second switch is coupled to a terminal of the first switch, the respective sense channel and the first input terminal of the respective programmable gain amplifier, and another terminal of the first switch is coupled to a common reference voltage; or in a self-capacitance scan mode, a terminal of the second current source is coupled to a second power supply voltage, another terminal of the second current source is coupled to a terminal of the second switch, another terminal of the second switch is coupled to a terminal of the first switch, the respective sense channel and the first input terminal of the respective programmable gain amplifier, and another terminal of the first switch is coupled to the first power supply voltage.

Optionally, the output terminal of the reference voltage generator circuit may be coupled to the control terminals of the second switches, wherein the reference voltage generator circuit is configured to control the charge/discharge circuits to charge or discharge the sense channels by using the reference voltage.

Optionally, each charge/discharge circuit may further include an OR logic circuit and a comparator, the comparator including a second input terminal coupled to a reference voltage, the comparator including a first input terminal coupled to the output terminal of the reference voltage generator circuit, the comparator including an output terminal coupled to a first input terminal of the OR logic circuit, the OR logic circuit including a second input terminal at which the first control signal is received, the OR logic circuit including an output terminal from which the second control signal is output.

Optionally, each charge/discharge circuit may further include a flip-flop and a delay, the flip-flop including a first input terminal coupled to the output terminal of the comparator, the flip-flop including a second input terminal coupled to an output terminal of the delay, the flip-flop including an output terminal coupled to the first input terminal of the OR logic circuit, the delay configured to delay the first control signal and then provide it to the flip-flop.

Optionally, the touch detection circuit may further include a digital-to-analog converter including two differential output terminals coupled respectively to the first and second input terminals of the programmable gain amplifiers, the digital-to-analog converter configured to provide the programmable gain amplifiers with two differential voltages with a difference therebetween, which is adjustable and used to account for non-ideal factors of a previous stage of the programmable gain amplifiers.

Optionally, each programmable gain amplifier may include an operational transconductance amplifier, a first input circuit and a second input circuit, a terminal of the first input circuit serving as the first input terminal of the programmable gain amplifier and coupled to one of the differential output terminals of the digital-to-analog converter and the output terminal of the respective charge/discharge circuit to access one of the differential voltages and the respective sense voltage, another terminal of the first input circuit coupled to a first input terminal of the operational transconductance amplifier, a terminal of the second input circuit serving as the second input terminal of the programmable gain amplifier and coupled to the other of the differential output terminals of the digital-to-analog converter and the output terminal of the reference voltage generator circuit to access the other of the differential voltages and the reference voltage, another terminal of the second input circuit coupled to a second input terminal of the operational transconductance amplifier, an output terminal of the operational transconductance amplifier coupled to the respective analog-to-digital converter.

The first input circuit may include a first sampling capacitor, a first amplifier switch and a first sampling switch, a terminal of the first sampling capacitor coupled to the first input terminal of the operational transconductance amplifier, another terminal of the first sampling capacitor coupled to a terminal of the first amplifier switch and a terminal of the first sampling switch, another terminal of the first sampling switch coupled to the output terminal of the respective charge/discharge circuit, another terminal of the first amplifier switch coupled to one of the differential output terminals of the digital-to-analog converter, or the second input circuit may include a second sampling capacitor, a second amplifier switch and a second sampling switch, a terminal of the second sampling capacitor coupled to the second input terminal of the operational transconductance amplifier, another terminal of the second sampling capacitor coupled to a terminal of the second amplifier switch and a terminal of the second sampling switch, another terminal of the second sampling switch coupled to the output terminal of the reference voltage generator circuit, another terminal of the second amplifier switch coupled to the other of the differential output terminals of the digital-to-analog converter, wherein both the first and second amplifier switches are turned on during an amplifying phase of the programmable gain amplifier, and both the first and second sampling switches are turned on during a sampling phase of the programmable gain amplifier.

Optionally, each programmable gain amplifier may further include a first feedback circuit and a second feedback circuit, a terminal of the first feedback circuit coupled to the output terminal of the operational transconductance amplifier, another terminal of the first feedback circuit coupled to the first input terminal of the operational transconductance amplifier, a terminal of the second feedback circuit coupled to the output terminal of the operational transconductance amplifier, another terminal of the second feedback circuit coupled to the second input terminal of the operational transconductance amplifier.

Optionally, the first feedback circuit may include a first feedback capacitor and a first feedback switch, a terminal of the first feedback capacitor coupled to the first sampling capacitor and the first input terminal of the operational transconductance amplifier, another terminal of the first feedback capacitor coupled to a terminal of the first feedback switch, another terminal of the first feedback switch coupled to the output terminal of the operational transconductance amplifier, or the second feedback circuit may include a second feedback capacitor and a second feedback switch, a terminal of the second feedback capacitor coupled to the second input terminal of the operational transconductance amplifier, another terminal of the second feedback capacitor coupled to a terminal of the second feedback switch, another terminal of the second feedback switch coupled to the output terminal of the operational transconductance amplifier, wherein both the first and second amplifier switches are turned on during an amplifying phase of the programmable gain amplifier.

Optionally, each programmable gain amplifier may further include first to fourth reset switches, a terminal of each of the first to fourth reset switches coupled to the common reference voltage, another terminal of the first reset switch coupled to the first input terminal of the operational transconductance amplifier, another terminal of the second reset switch coupled to a node at which the first feedback capacitor is coupled to the first feedback switch, another terminal of the third reset switch coupled to a node at which the second feedback capacitor is coupled to the second feedback switch, another terminal of the fourth reset switch coupled to the second input terminal of the operational transconductance amplifier, wherein the first to fourth reset switches are all turned on during a sampling phase of the programmable gain amplifier.

Optionally, in the touch detection circuit, at least the digital-to-analog converter or the reference voltage generator circuit may be commonly shared by the sense channels.

The present disclosure further provides a touch sensing chip including the touch detection circuit of the present disclosure.

The present disclosure further provides an electronic device including a touch screen and the touch sensing chip of the present disclosure. The touch screen includes a number of sense channel, and the touch sensing chip is coupled to each of the sense channels.

BRIEF DESCRIPTION OF THE DRAWINGS

Those of ordinary skill in the art would appreciate that the accompanying drawings are provided to facilitate a better understanding of the present disclosure and do not limit the scope thereof in any sense, in which.

DETAILED DESCRIPTION

Figure 1:
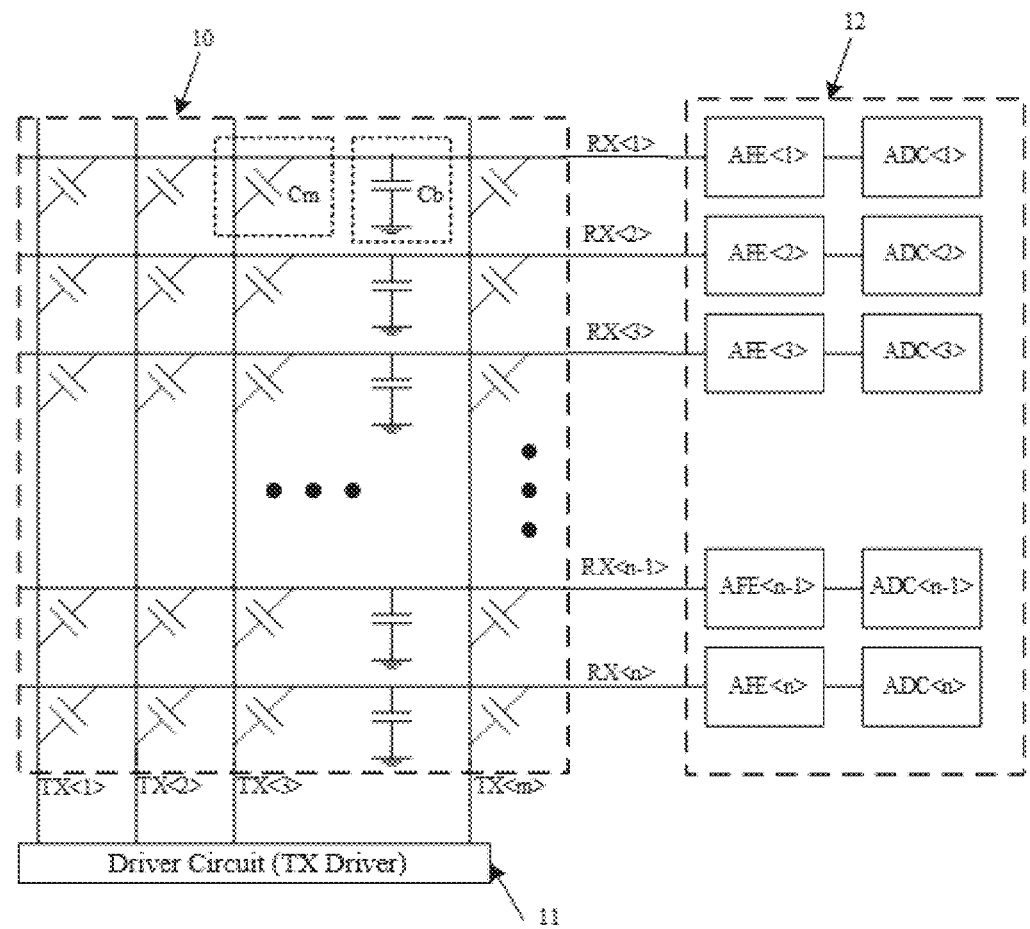
FIG. 1 schematically illustrates operation of a conventional touch sensing chip.

The following description sets forth numerous specific details in order to provide a more thorough understanding of the present disclosure. However, it will be apparent to those skilled in the art that the present disclosure can be practiced without one or more of these specific details. In other instances, well-known technical features have not been described in order to avoid unnecessary obscuring of the disclosure. It is to be understood that the disclosure may be embodied in many different forms and should not be construed as being limited to the embodiments set forth below. Rather, these embodiments are provided so that this disclosure is thorough and conveys the scope of the disclosure to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

A touch sensing chip for use in a conventional organic light-emitting diode (OLED) touch screen is schematically depicted in FIG. 1. Typically, the OLED touch screen 10 has a number of longitudinally running transmit channels (or transmit lines) TX and a number of transversely running sense channels (or sense lines) RX. The transmit channels TX cross the sense channels RX at sense nodes. Typically, the touch sensing chip includes a driver circuit 11 coupled to the transmit channels TX and a touch detection circuit 12 coupled to the sense channels RX. Depending on the size and shape of the OLED touch screen 10, the numbers of transmit TX and sense RX channels may vary. In the OLED touch screen 10 shown in FIG. 1, there are n sense channels RX and m transmit channels TX. That is, the OLED touch screen 10 is a screen model with n sense channels RX (i.e., RX<1>-<n>) and m transmit channels TX (i.e., TX<1>-<m>).

Since the human body is a conductor which is grounded, when a finger touches or approaches a channel, both its self-capacitance and mutual capacitance will vary. Therefore, both these types of capacitance can be utilized for touch recognition. For example, the touch sensing chip may detect a self-capacitance or mutual capacitance change occurring in the OLED touch screen 10 and calculate from the change the location of a finger touch that caused the change. That is, the touch on the OLED touch screen 10 is recognized. For example, in a self-capacitance detection mode, the touch sensing chip may scan each transmit channel and each sense channel to see if there is a change in its self-capacitance to ground. When a finger approaches or comes into contact with the screen, transmit TX and sense RX channels in the vicinity of the finger will experience a rise in self-capacitance. In a mutual capacitance detection mode, the touch sensing chip may detect variation of mutual capacitance between the transmit TX and sense RX channels. In FIG. 1, Cm denotes parasitic capacitance between the transmit TX and sense RX channels, and Cb denotes parasitic capacitance between cathodes of the OLED touch screen 10 and the sense channels RX.

The conventional touch detection circuit 12 usually includes analog front-end circuits AFE and analog-to-digital converter (ADC) circuits ADC.

Figure 2:
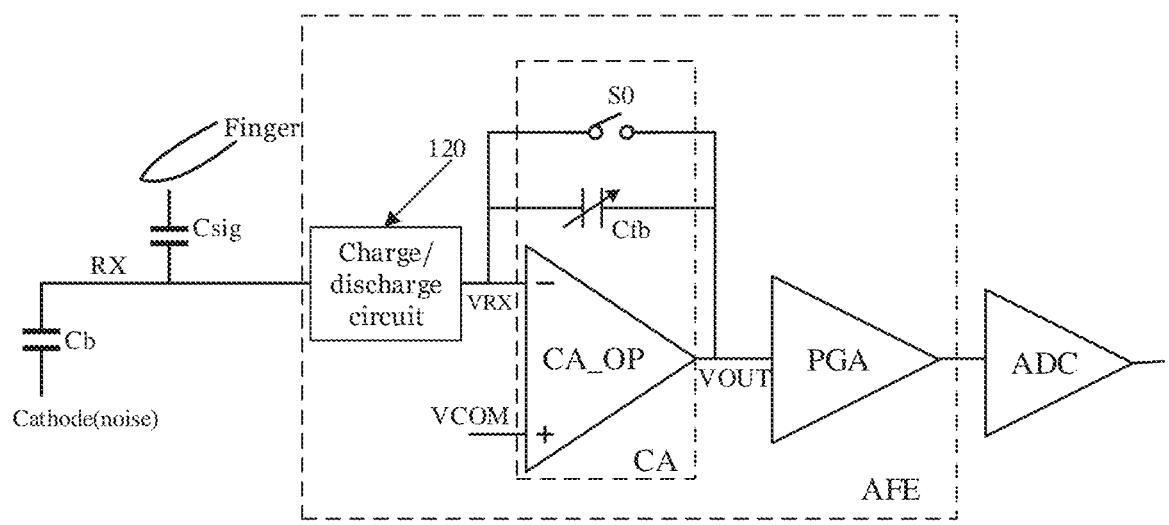
FIG. 2 illustrates a schematic structural view of a touch detection circuit in the conventional touch sensing chip.

FIG. 2 shows operation of an analog front-end circuit AFE in the conventional touch detection circuit 12 for use in the OLED touch screen. For example, the analog front-end circuit AFE operates in a self-capacitance detection mode. The analog front-end circuit AFE includes a charge/discharge circuit 120, a charge integrator CA and a programmable gain amplifier PGA. The charge integrator CA includes a charge amplifier CA_OP, an integrator switch M0 and an integrator capacitor Cfb. In FIG. 2, Cathode denotes a respective cathode of the OLED touch screen; Csig denotes capacitance between a finger and a respective sense channel RX produced as a result of a touch on the OLED touch screen by the finger (i.e., a capacitance component between the finger and the touch screen); and Cb denotes parasitic capacitance between the cathode and the sense channel RX, which is often as high as several hundred pF. When noise from the cathode Cathode is not considered, Cb can be considered as parasitic capacitance between the sense channel RX and a ground AVSS.

Given the fact that Csig is produced by a touch on the screen by a finger or the like and disappears after the finger leaves the screen, the touch sensing chip operates by determining the presence and location of a touch on the OLED touch screen 10 through scanning each of the transmit and sense channels to find whether there is a change in its self-capacitance to ground (i.e., to find out the presence of Csig).

Figure 3:
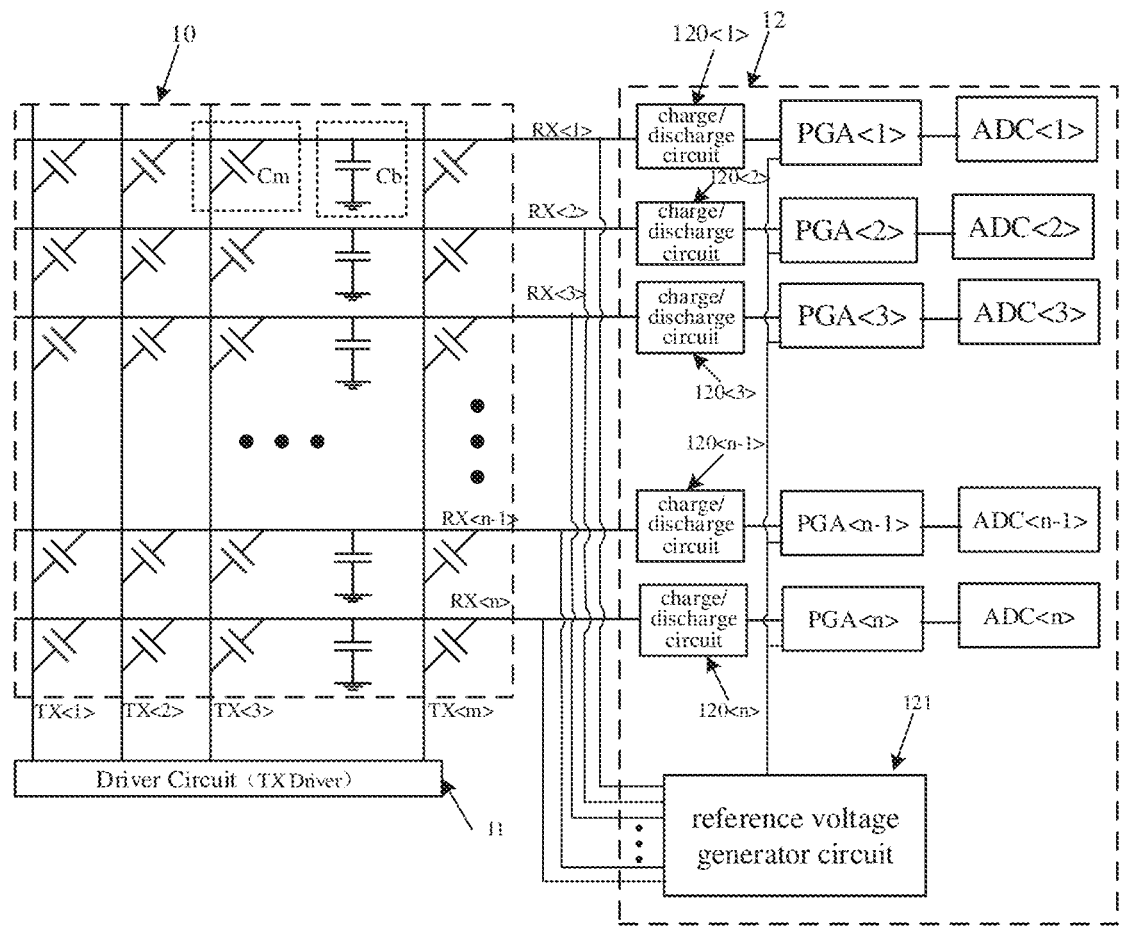
FIG. 3 schematically illustrates operation of a touch detection circuit according to a first embodiment of the present disclosure.

With combined reference to FIGS. 2 and 3, in an initial scan performed by the touch sensing chip (there is no finger touch on the OLED touch screen), the charge/discharge circuit 120 pulls the sense channel RX to a ground potential and resets the charge amplifier CA_OP. After that, the charge/discharge circuit 120 charges the sense channel RX to a potential VRX equal to a common reference voltage VCOM. In this process, an amount of charge Q delivered by the charge/discharge circuit 120 to the sense channel RX can be expressed as Q=VCOM*Cb. In response to a finger touch, this scanning process is repeated.

After an output is provided by the charge/discharge circuit 120 to the charge integrator CA, Q+(VCOM−VOUT)*Cfb=VCOM*(Cb+Csig) is satisfied, from which VOUT=VCOM−VCOM*Csig/Cfb can be obtained.

The programmable gain amplifier PGA is generally designed to operate in a correlated double sampling mode, in which a first VOUT sample is taken and denoted as VOUT1 and a second VOUT sample is taken and denoted as VOUT2 in each scanning period. If there is no finger touch, Csig=0, and a voltage difference between the two VOUT samples will be obtained as ΔVOUT=VOUT2−VOUT1=0.

If there is a finger touch, Csig≠0, and a voltage difference between the two VOUT samples will be obtained as ΔVOUT=VOUT2−VOUT1=−VCOM*Csig/Cfb.

ΔVOUT is amplified by PGA and quantized by ADC, and the presence and location of a touch on the touch screen can be determined based on a result of the quantization.

The present disclosure will be described in greater detail below by way of specific embodiments with reference to FIGS. 3 to 11. From the following description, advantages and features of the disclosure will become more apparent. Note that the figures are provided in a very simplified form not necessarily drawn to exact scale and only for the sake of easier and clearer description of the embodiments disclosed herein.

Embodiment 1

Referring to FIG. 3, a touch detection circuit 12 according to one embodiment of the present disclosure is shown, which is coupled to a touch screen 10 and used to detect capacitance variation in the touch screen 10. Results of detection of the touch detection circuit 12 can be used to determine the location of a touch event occurring on the touch screen 10 and a user's touch operation.

The touch screen 10 may be an OLED touch screen or any other touch screen, which has m longitudinally running transmit channels TX (i.e., TX<1>-<m>) and n transversely running sense channels RX (i.e., RX<1>-<n>). The transmit channels TX cross the sense channels RX at sense nodes, and both m and n depend on the size and shape of the touch screen 10.

In this embodiment, the touch detection circuit 12 includes a number of touch detection branches (not labeled in FIG. 3). The number of touch detection branches is equal to that of sense channels RX, and each of the touch detection branches is coupled to a respective one of the sense channels RX. Each touch detection branch includes a charge/discharge circuit 120, a programmable gain amplifier PGA and an analog-to-digital converter ADC, which are connected in sequence. The touch detection circuit 12 further includes a reference voltage generator circuit 121 coupled to the charge/discharge circuits 120 in the touch detection branches.

The charge/discharge circuit 120 is used to charge or discharge the respective sense channel RX over a scanning period, in which case a sense signal on the sense channel RX converts into a sense voltage VRX. The reference voltage generator circuit 121 is coupled to j sense channels RX in the touch screen 10 and configured to produce a reference voltage VRXM, which is related to each of voltages on the respective j sense channels RX, where j is an integer satisfying 2≤j≤n. The programmable gain amplifier PGA is configured to amplify a difference between the sense voltage VRX and the reference voltage VRXM. The analog-to-digital converter ADC is configured to quantize the amplified difference from the programmable gain amplifier PGA.

For example, an output terminal of the charge/discharge circuit 120<1> is coupled to the sense channel RX<1> and a first input terminal of the programmable gain amplifier PGA<1>, and an output terminal of the programmable gain amplifier PGA<1> is coupled to an input terminal of the analog-to-digital converter ADC<1>; an output terminal of the charge/discharge circuit 120<2> is coupled to the sense channel RX<2> and a first input terminal of the programmable gain amplifier PGA<2>, and an output terminal of the programmable gain amplifier PGA<2> is coupled to an input terminal of the analog-to-digital converter ADC<2>; an output terminal of the charge/discharge circuit 120<3> is coupled to the sense channel RX<3> and a first input terminal of the programmable gain amplifier PGA<3>, and an output terminal of the programmable gain amplifier PGA<3> is coupled to an input terminal of the analog-to-digital converter ADC<3>; . . . ; an output terminal of the charge/discharge circuit 120<n−1> is coupled to the sense channel RX<n−1> and a first input terminal of the programmable gain amplifier PGA<n−1>, and an output terminal of the programmable gain amplifier PGA<n−1> is coupled to an input terminal of the analog-to-digital converter ADC<n−1>; and an output terminal of the charge/discharge circuit 120<n> is coupled to the sense channel RX<n> and a first input terminal of the programmable gain amplifier PGA<n>, and an output terminal of the programmable gain amplifier PGA<n> is coupled to an input terminal of the analog-to-digital converter ADC<n>. The reference voltage generator circuit 121 is coupled to each of second input terminals of the respective programmable gain amplifiers PGA<1>-<n>.

It would be appreciated that although the touch detection branches have been described above in this embodiment as being coupled to the respective sense channels RX, the present disclosure is not so limited. In other embodiments of the present disclosure, at least part of one touch detection branch may be commonly shared by multiple sense channels RX. For example, multiple PGAs may be coupled to a single ADC. As another embodiment, a single charge/discharge circuit 120 may be coupled to multiple PGAs. Any circuit design can be suitably used, as long as the charge/discharge circuits 120, the programmable gain amplifiers PGA, the analog-to-digital converters ADC and the reference voltage generator circuit 121 can perform their intended functions. Therefore, in this embodiment, the charge/discharge circuit 120, the reference voltage generator circuit 121, the programmable gain amplifier PGA and the analog-to-digital converter ADC may each employ any suitable circuit design.

Figure 4A:
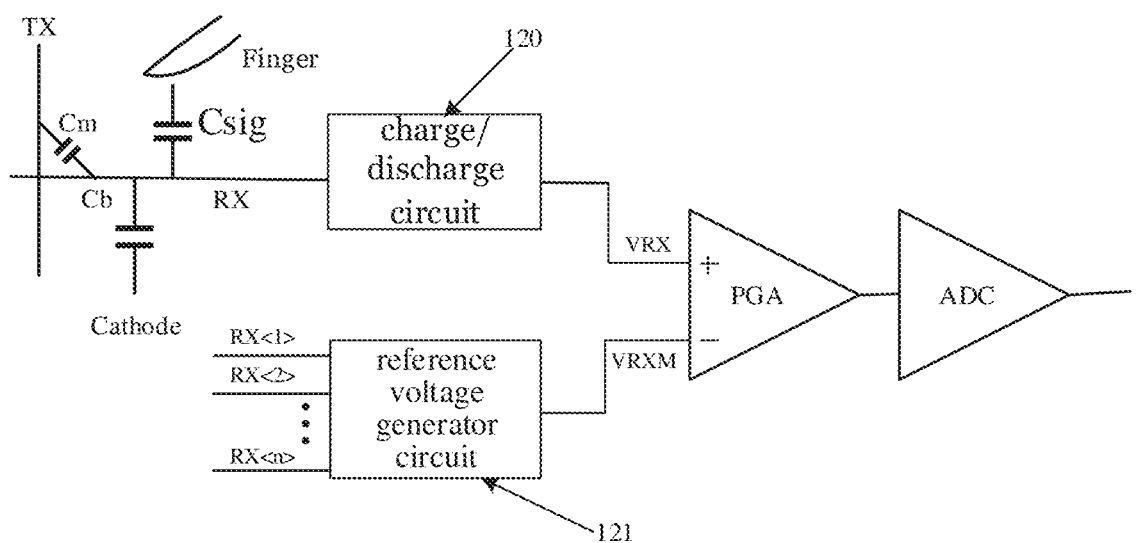
FIG. 4A illustrates a schematic diagram showing an exemplary architecture of the touch detection circuit according to the first embodiment of the present disclosure.
Figure 4B:
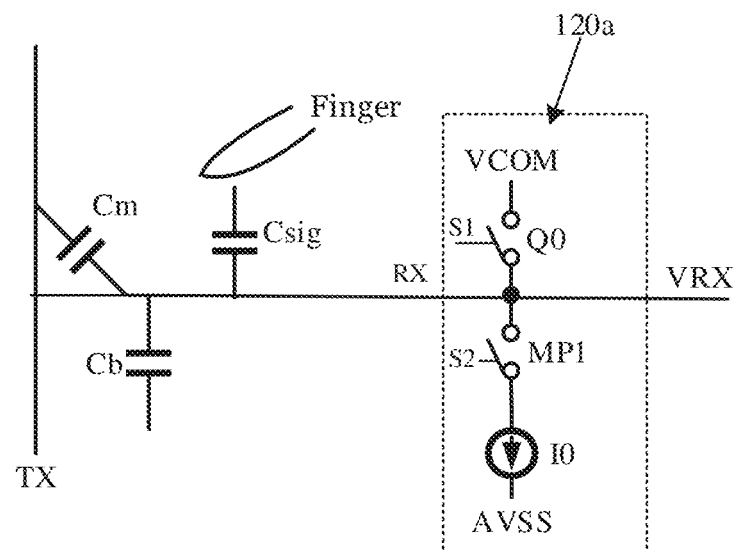
FIG. 4B illustrates a schematic diagram showing an exemplary architecture of a charge/discharge circuit in the touch detection circuit of FIG. 4A.

As an example, referring to FIGS. 4A and 4B, the charge/discharge circuit 120 may operate in a mutual capacitance scan mode. In this case, it includes a charge/discharge branch 120a, the charge/discharge branch 120a includes a first switch Q0, a second switch MP1 and a current source I0. The first switch Q0 and the second switch MP1 may be each implemented as any suitable three-terminal switching element such as a MOS transistor, a triode, etc. The first switch Q0 has a control terminal for receiving a first control signal S1, and the second switch MP1 has a control terminal (e.g., a gate of a PMOS transistor) for receiving a second control signal S2 that is different from the first control signal S1. One terminal of the current source I0 is coupled to a first power supply voltage AVSS (provided by an internal ground voltage, which may differ from an external ground voltage, or be of 0 V), and another terminal thereof is coupled to one terminal of the second switch MP1 (e.g., a source of the PMOS transistor). Another terminal of the second switch MP1 (e.g., a drain of the PMOS transistor) is coupled to one terminal of the first switch Q0, the sense channel RX and the first input terminal of the programmable gain amplifier PGA, and another terminal of the first switch Q0 is coupled to the common reference voltage VCOM.

When a touch event occurs as a result of a conductor like a finger approaching or coming into contact with the touch screen 10, Csig (a capacitance component between the finger and the touch screen) will be produced, causing a change in mutual capacitance between transmit TX and sense RX channels at the location of the touch event, from Cm to Cm-Csig (e.g., the equivalent parasitic capacitance between the transmit TX and sense RX channels varies). The respective touch detection branch in the touch detection circuit 12 can detect the presence of Csig. When the conductor (e.g., a finger) leaves the screen (i.e., there is no touch event any more, or the touch event is cancelled), Csig disappears. Therefore, the presence of Csig in the touch screen 10 can be determined from results of detection of all the touch detection branches in the touch detection circuit 12 coupled to the touch screen 10. Accordingly, the occurrence and location of a touch event on the touch screen 10 can be determined.

For example, during operation of the charge/discharge branch 120a, at first, the signal S1 transitions high, closing (turning on) Q0. As a result, the touch detection branch is reset, and a potential of the sense channel RX is pulled to VCOM. After the reset is completed, the signal S1 transitions low, turning off Q0. In response to a transmit channel TX transitioning high (i.e., from a low level to a high level), the signal S2 transitions high, closing (turning on) MP1. As a result, the second current source I0 in the charge/discharge branch 120a charges or discharges the sense channel RX, changing its voltage from the reference, in which case the capacitance variation Csig converts into a sense voltage VRX carrying touch information. A sense voltage VRX produced in the presence of a finger touch differs from that produced in the absence of a finger touch, and quantizing a difference therebetween allows determining the magnitude of Csig and hence the presence of a touch on the touch screen 10.

Figure 5A:
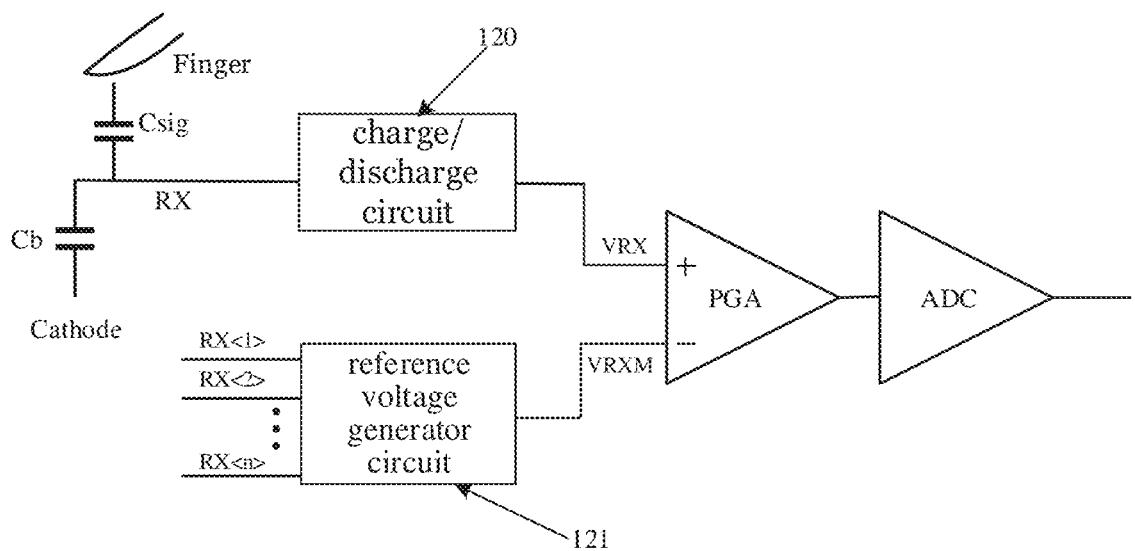
FIG. 5A illustrates a schematic diagram showing another exemplary architecture of the touch detection circuit according to the first embodiment of the present disclosure.
Figure 5B:
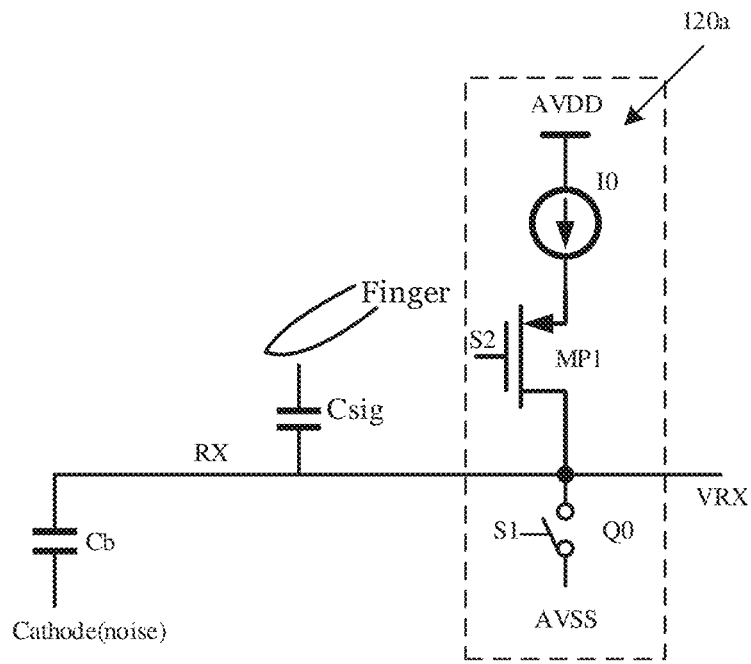
FIG. 5B illustrates a schematic diagram showing an exemplary architecture of a charge/discharge circuit in the touch detection circuit of FIG. 5A.

As another example, referring to FIGS. 5A and 5B, the charge/discharge circuit 120 may operate in a self-capacitance scan mode. In this case, it includes a charge/discharge branch 120a, the charge/discharge branch 120a includes a first switch Q0, a second switch MP1 and a second current source I0. The first switch Q0 has a control terminal for receiving a first control signal S1, and the second switch MP1 has a control terminal (e.g., a gate of a PMOS transistor) for receiving a second control signal S2 that is different from the first control signal S1. One terminal of the second current source I0 is coupled to an associated second power supply voltage AVDD (which may be provided by an operating voltage of the system), and another terminal of the second current source I0 is coupled to one terminal of the second switch MP1 (e.g., a source of the PMOS transistor). Another terminal of the second switch MP1 (e.g., a drain of the PMOS transistor) is coupled to one terminal of the first switch Q0, the sense channel RX and the first input terminal of the programmable gain amplifier PGA, and another terminal of the first switch Q0 is coupled to a first power supply voltage AVSS.

When a touch event occurs as a result of a conductor like a finger approaching or coming into contact with the touch screen 10, self-capacitance of a sense channel RX at the location of the touch event will change, producing Csig (a capacitance component between the finger and the touch screen). The respective touch detection branch in the touch detection circuit 12 can detect the presence of Csig. When the conductor (e.g., a finger) leaves the screen (i.e., there is no touch event any more, or the touch event is cancelled), Csig disappears. Therefore, the presence of Csig in the touch screen 10 can be determined from results of detection of all the touch detection branches in the touch detection circuit 12 coupled to the touch screen 10. Accordingly, the occurrence and location of a touch event on the touch screen 10 can be determined.

Operation of the charge/discharge branch 120a involves, at first, causing the signal S1 to transition high, thereby closing (turning on) Q0. As a result, the touch detection branch is reset, and during the reset, the charge/discharge branch 120a discharges the sense channel RX until its sense channel drops to AVSS. As soon as the reset is completed, the signal S2 transitions high, closing MP1. As a result, the charge/discharge branch 120a charges the sense channel RX over the period in which S2 stays high. In this way, the self-capacitance variation Csig is converted into a sense voltage VRXg carrying information about the finger.

As can be seen from the above description of the operation, the second current source I0 charges the sense channel RX when S2 is high, and the sense channel RX is charged to a voltage in the presence of a finger touch lower than a voltage, to which the sense channel RX is charged in the absence of a finger touch. Therefore, similarly, a sense voltage VRX produced in the presence of a finger touch differs from that produced in the absence of a finger touch, and a difference therebetween can be utilized to determine the magnitude of Csig and hence the presence of a touch on the touch screen 10.

Figure 6:
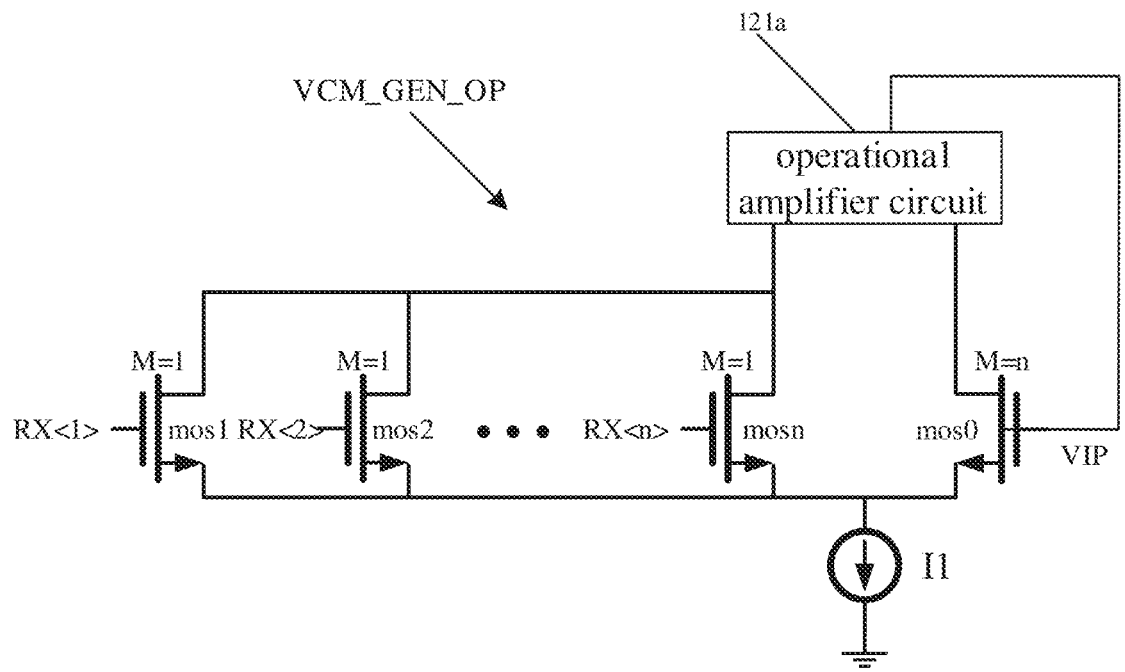
FIG. 6 illustrates a schematic diagram showing an exemplary structure of a reference voltage generator circuit in the touch detection circuit according to the first embodiment of the present disclosure.
Figure 7:
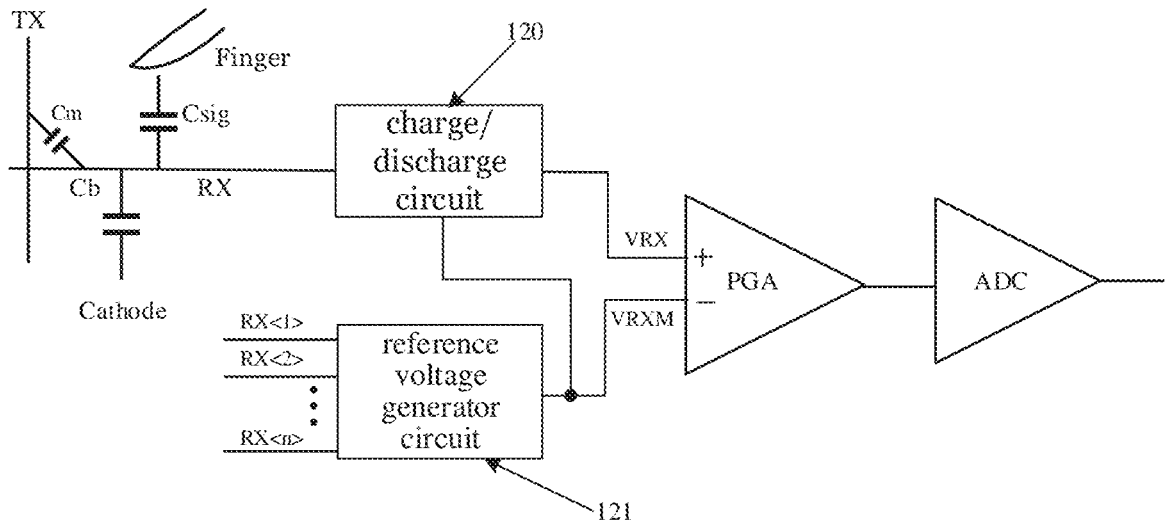
FIG. 7 illustrates a schematic diagram showing an exemplary structure of a touch detection circuit according to a second embodiment of the present disclosure.

As an exemplary, referring to FIG. 6, the reference voltage generator circuit 121 may include an operational amplifier VCM_GEM_OP having a first input terminal (+) and n second input terminals (−), the n second input terminals (−) are coupled to the respective n sense channels RX<1>-RX<n>. The first input terminal of the operational amplifier VCM_GEM_OP is coupled to an output terminal of the operational amplifier VCM_GEM_OP. The operational amplifier VCM_GEM_OP is configured to determine an average of voltages on the n sense channels RX<1>-RX<n> and take the average as a reference voltage VRXM, i.e., VRXM=(RX<1>+RX<2>+RX<2>+ . . . +RX<n>)/n.

The operational amplifier VCM_GEM_OP may employ any suitable circuit design. As an example, with combined reference to FIGS. 3 and 6, the operational amplifier VCM_GEM_OP may include one first input transistor mos0, n identical second input transistors mos1-mosn and an operational amplifier circuit 121a. A gate of the first input transistor mos0 is coupled to an output terminal of the operational amplifier circuit 121a and the second input terminals of PGA<1>-PGA<n>. A drain of the first input transistor mos0 is coupled to a first input terminal of the operational amplifier circuit 121a. A source of the first input transistor mos0 and sources of the n second input transistors mos1-mosn are all coupled to a first current source I1. Drains of the n second input transistors mos1-mosn are all coupled to a second input terminal of the operational amplifier circuit 121a, and gates of the n second input transistors mos1-mosn are coupled to the respective sense channels RX<1>-RX<n>. That is, the gate of mos1 is coupled to the sense channel RX<1>, the gate of mos2 to the sense channel RX<2>, . . . , and the gate of mosn to the sense channel RX<n>.

The second input transistors mos1-mosn may have the same width-to-length ratio, and the first input transistor mos0 may have a width-to-length ratio n times that of the second input transistors most-mosn. The operational amplifier VCM_GEM_OP is equivalent to a regular operational amplifier with one terminal of its input transistor pair being divided into n sub-terminals. Moreover, since the voltages received by the second input transistors mos1-mosn from the RX<1>-RX<n> are comparable and have little variation, the operational amplifier VCM_GEM_OP can operate in a linear region and may be configured as a unity-gain amplifier (i.e., its output terminal is coupled to the gate of mos0). In this way, the output VRXM of the operational amplifier VCM_GEM_OP is equal to the average of the voltages that it receives from RX<1>-RX<n>.

For example, in the self-capacitance scan mode shown in FIGS. 3, 5A to 5B and 6, each touch detection branch in this embodiment may operate as follows:

At the beginning, S1 transitions high, closing Q0. The charge/discharge branch 120a discharges the sense channel RX through Q0 and outputs a low voltage VRX (equal to AVSS).

When S1 transitions low and turns off Q0, S2 transitions high, turning on MP1. As a result, the second current source I0 charges the sense channel RX and outputs a sense voltage VRX. At the same time, the reference voltage generator circuit 121 produces a reference voltage VRXM based on RX<1>-RX<n>.

Subsequently, PGA samples the voltages VRX and VRXM, amplifies a difference between them and provides the amplified signal to ADC for quantization. Across the touch screen 10, for any touched sense channel RX, VRX output from the charge/discharge circuit 120 coupled thereto is lower than VRXM, and for any untouched sense channel RX, VRX output from the charge/discharge circuit 120 coupled thereto is higher than VRXM. Such differences are amplified by PGA and quantized by ADC to allow for determining which sense channels are touched and which sense channels are not.

According to this embodiment, firstly, the reference voltage generator circuit 121 provides the reference voltage VRXM as an average of voltages on the sense channels RX<1>-RX<n>, instead of through a dedicated sense channel or other reference voltage source. This makes the product suitable for use in a wider range of applications and of higher utility. Secondly, since the reference voltage generator circuit 121 takes an average of voltages on the sense channels RX<1>-RX<n> as the reference voltage VRXM, noise from cathodes Cathode has the same impact on all the sense channels RX<1>-RX<n>. This immunizes differences between VRX and VRXM from interference from noise from the cathodes (also known as common-mode noise), in which case the influence of such noise on touch detection of the touch screen is suppressed and touch sensing sensitivity and reliability are improved. Thirdly, compared with conventional touch detection circuits, the use of charge integrators (especially integrator amplifiers and integrator capacitors therein) is dispensed with, resulting in significant chip area and cost savings.

Referring to FIG. 3, in this embodiment, there is also provided a touch sensing chip including the touch detection circuit 12 of this embodiment.

Optionally, the touch sensing chip may further include a driver circuit 11, the driver circuit 11 is coupled to the transmit channels TX in the touch screen 10. In other embodiments of the present disclosure, the driver circuit 11 may be integrated into a driver chip separate from the touch sensing chip.

Referring to FIG. 3, in this embodiment, there is also provided an electronic device including the touch screen 10 and the touch sensing chip of this embodiment.

The touch sensing chip and the electronic device both have improved performance because of the touch detection circuit of this embodiment incorporated therein.

It would be appreciated that although VRXM output from the reference voltage generator circuit 121 has been described above as being equal to an average of voltages on RX<1>-RX<n>, this is merely an example and is not intended to limit the present disclosure in any way. In other embodiments of the present disclosure, VRXM output from the reference voltage generator circuit 121 may be another value related to all the voltages on RX<1>-RX<n>, such as a weighted value calculated from the voltages on RX<1>-RX<n> assigned with different weights. As long as VRXM output from the reference voltage generator circuit 121 is related to at least two of RX<1>-RX<n>, an effect of suppressing the influence of noise from the cathodes on touch detection of the touch screen can be obtained. It is within the scope of the present disclosure for the reference voltage generator circuit 121 to employ other circuit designs.

Embodiment 2

With combined reference to FIGS. 3, 7 and 8A to 8B, in a further embodiment of the present disclosure, there is provided a touch detection circuit 12, which is coupled to a touch screen 10 and used to detect capacitance variation in the touch screen 10. Results of detection of the touch detection circuit 12 can be used to determine the location of a touch event occurring on the touch screen 10 and a user's touch operation. The touch detection circuit 12 includes a number of touch detection branches (not labeled in FIG. 3). The touch detection branches may be coupled to respective sense channels RX, or may be each coupled to a plurality of sense channels RX. The touch detection circuit 12 may operate either in a mutual capacitance scan mode or in a self-capacitance scan mode and may include charge/discharge circuits 120 having charge/discharge branches 120a coupled to the sense channels RX.

The touch detection circuit 12 of this embodiment differs from that of the first embodiment in that an output terminal of a reference voltage generator circuit 121 thereof is further coupled to control terminals of charge/discharge branches 120a in the charge/discharge circuits 120 of the touch detection branches. With this arrangement, a reference voltage VRXM (as a feedback) output from the reference voltage generator circuit 121 can control a depth of charge/discharge of each sense channel RX by the respective charge/discharge branch 120a coupled thereto (i.e., a controllable amount of charge can be charged to or discharged from each sense channel RX by the respective charge/discharge branch 120a coupled thereto).

Figure 8A:
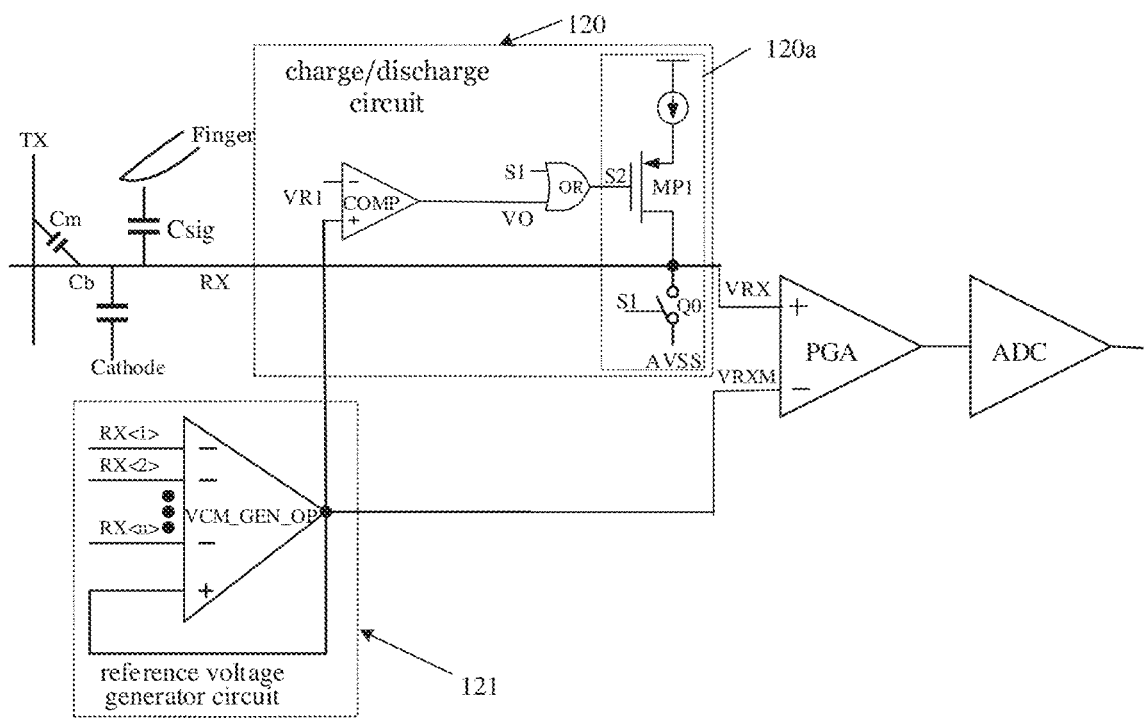
FIGS. 8A and 8B are schematic diagrams showing two exemplary structures of the touch detection circuit according to the second embodiment of the present disclosure.

As an example, referring to FIG. 8A, each charge/discharge circuit 120 may include a charge/discharge branch 120a, an OR logic circuit OR and a comparator COMP. The charge/discharge branch 120a includes a first switch Q0, a second switch MP1 and a second current source I0. A second input terminal (−) of the comparator COMP is coupled to a reference voltage VR1, and a first input terminal (+) of the comparator COMP is coupled to the output terminal of the reference voltage generator circuit 121 in order to receive the reference voltage VRXM therefrom. An output terminal of the comparator COMP is coupled to a first input terminal of the OR logic circuit OR, and a second input terminal of the OR logic circuit OR receives a first control signal S1. An output terminal of the OR logic circuit OR is coupled to a control terminal of the second switch MP1 and configured to output a second control signal S2 to the second switch MP1. The first control signal S1 is also fed to a control terminal of the first switch Q0.

The first switch Q0, the second switch MP1 and the second current source I0 in the charge/discharge branch 120a are wired in the same manner as described in the first embodiment, and further description thereof is omitted herein. Likewise, the charge/discharge branches 120a are coupled to the sense channels RX and programmable gain amplifiers PGA in the same manner as described in the first embodiment, and further description thereof is omitted herein.

This example is exemplified in the context of operation in the mutual capacitance scan mode. At the beginning, S1 transitions high, closing Q0. As a result, the charge/discharge branch 120a discharges the sense channel RX through Q0, pulling its voltage VRX down to AVSS. Moreover, VO output from the comparator COMP is also low. When S1 transitions low and thus turns off Q0, S2 transitions high, closing (turning on) MP1. In response, the second current source I0 charges the sense channel RX. Upon VRXM reaching the reference voltage VR1, VO output from the comparator COMP transitions high, stopping the charging process. After that, PGA samples the voltages VRX and VRXM, amplifies a difference between them and provides the amplified signal to ADC for quantization.

Figure 8B:
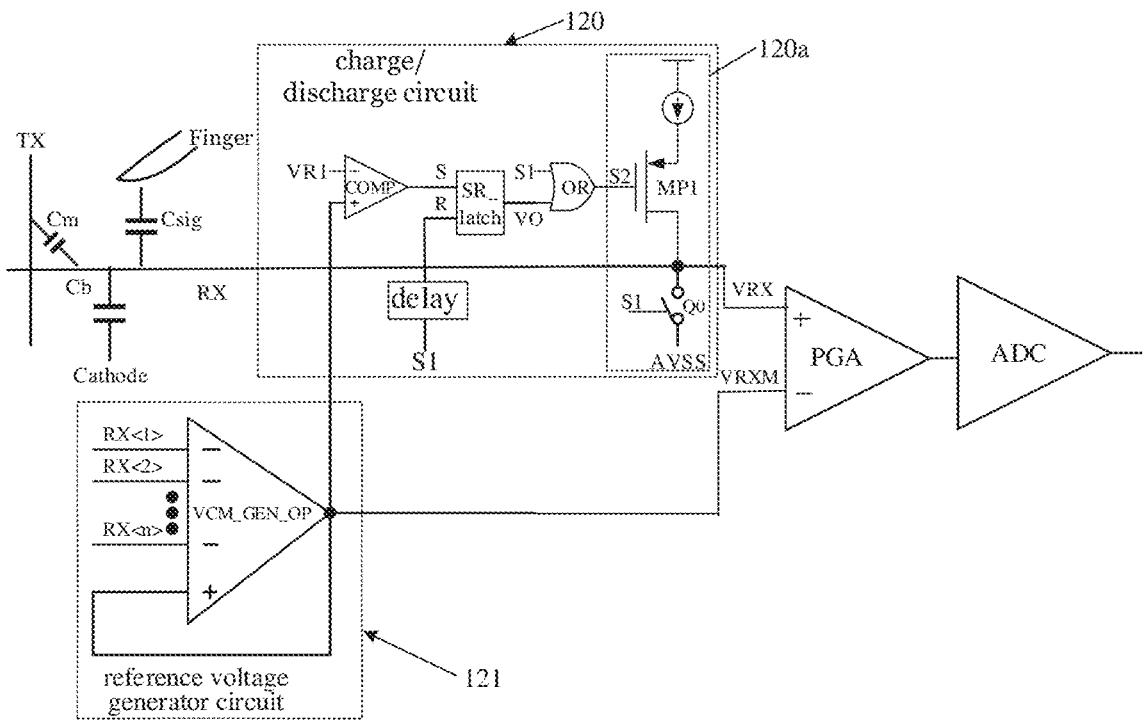

As an example, referring to FIG. 8B, each charge/discharge circuit 120 may include a charge/discharge branch 120a, an OR logic circuit OR, a flip-flop SR_latch, a delay Delay and a comparator COMP. The charge/discharge branch 120a includes a first switch Q0, a second switch MP1 and a second current source I0. A second input terminal (−) of the comparator COMP is coupled to a reference voltage VR1, and a first input terminal (+) of the comparator COMP is coupled to the output terminal of the reference voltage generator circuit 121 in order to receive the reference voltage VRXM therefrom. An output terminal of the comparator COMP is coupled to a first input terminal S of the flip-flop SR latch. An input terminal of the delay Delay, a control terminal of the first switch Q0 and a second input terminal of the OR logic circuit OR all receive a first control signal S1. An output terminal of the delay Delay is coupled to a second input terminal R of the flip-flop SR latch, and an output terminal of the flip-flop SR_latch is coupled to a first input terminal of the OR logic circuit OR. An output terminal of the OR logic circuit OR is coupled to a control terminal of the second switch MP1 and configured to output a second control signal S2 to the second switch MP1.

The first switch Q0, the second switch MP1 and the second current source I0 in the charge/discharge branch 120a are wired in the same manner as described in the first embodiment, and further description thereof is omitted herein. Likewise, the charge/discharge branches 120a are coupled to the sense channels RX and programmable gain amplifiers PGA in the same manner as described in the first embodiment, and further description thereof is omitted herein.

This example is exemplified in the context of operation in the mutual capacitance scan mode. At the beginning, S1 transitions high, closing Q0. As a result, the charge/discharge branch 120a discharges the sense channel RX through Q0, pulling its voltage VRX down to AVSS. Moreover, S output from the comparator COMP is also low. When S1 transitions low and thus turns off Q0, S2 transitions high, closing (turning on) MP1. In response, the second current source I0 charges the sense channel RX. Upon VRXM reaching the reference voltage VR1, S output from the comparator COMP transitions high, stopping the charging process. After that, PGA samples the voltages VRX and VRXM, amplifies a difference between them and provides the amplified signal to ADC for quantization.

Referring to FIG. 3, in this embodiment, there is also provided a touch sensing chip including the touch detection circuit 12 of this embodiment.

Referring to FIG. 3, in this embodiment, there is also provided an electronic device including the touch screen 10 and the touch sensing chip of this embodiment.

The touch sensing chip and the electronic device both have improved performance because of the touch detection circuit of this embodiment incorporated therein.

In summary, the touch detection circuit, touch sensing chip and electronic device of this embodiment have better overall performance than those of the first embodiment.

Embodiment 3

Figure 9:
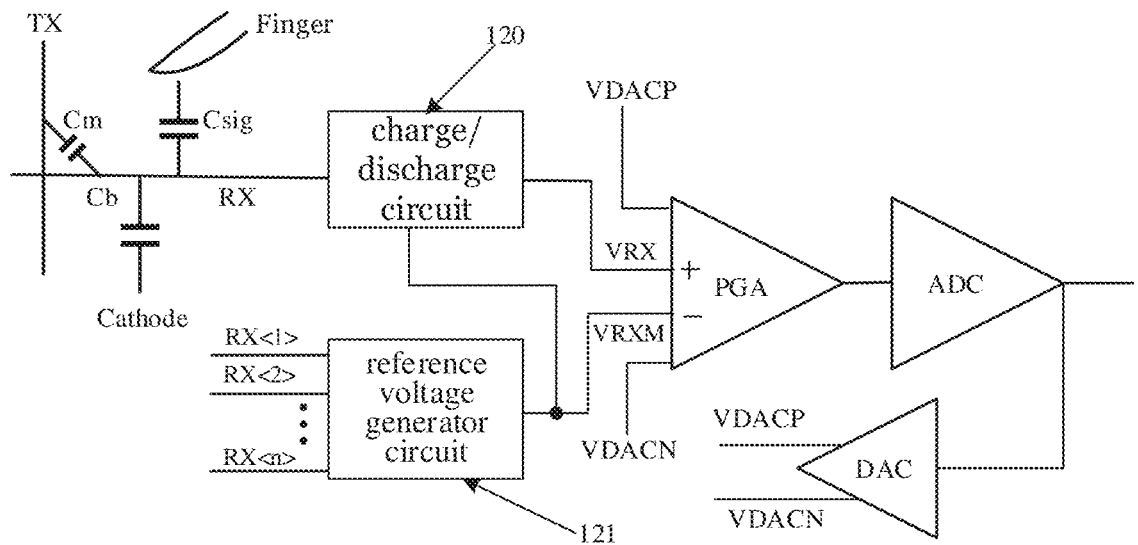
FIG. 9 illustrates a schematic diagram showing an architecture of a touch detection circuit according to a third embodiment of present disclosure.
Figure 10:
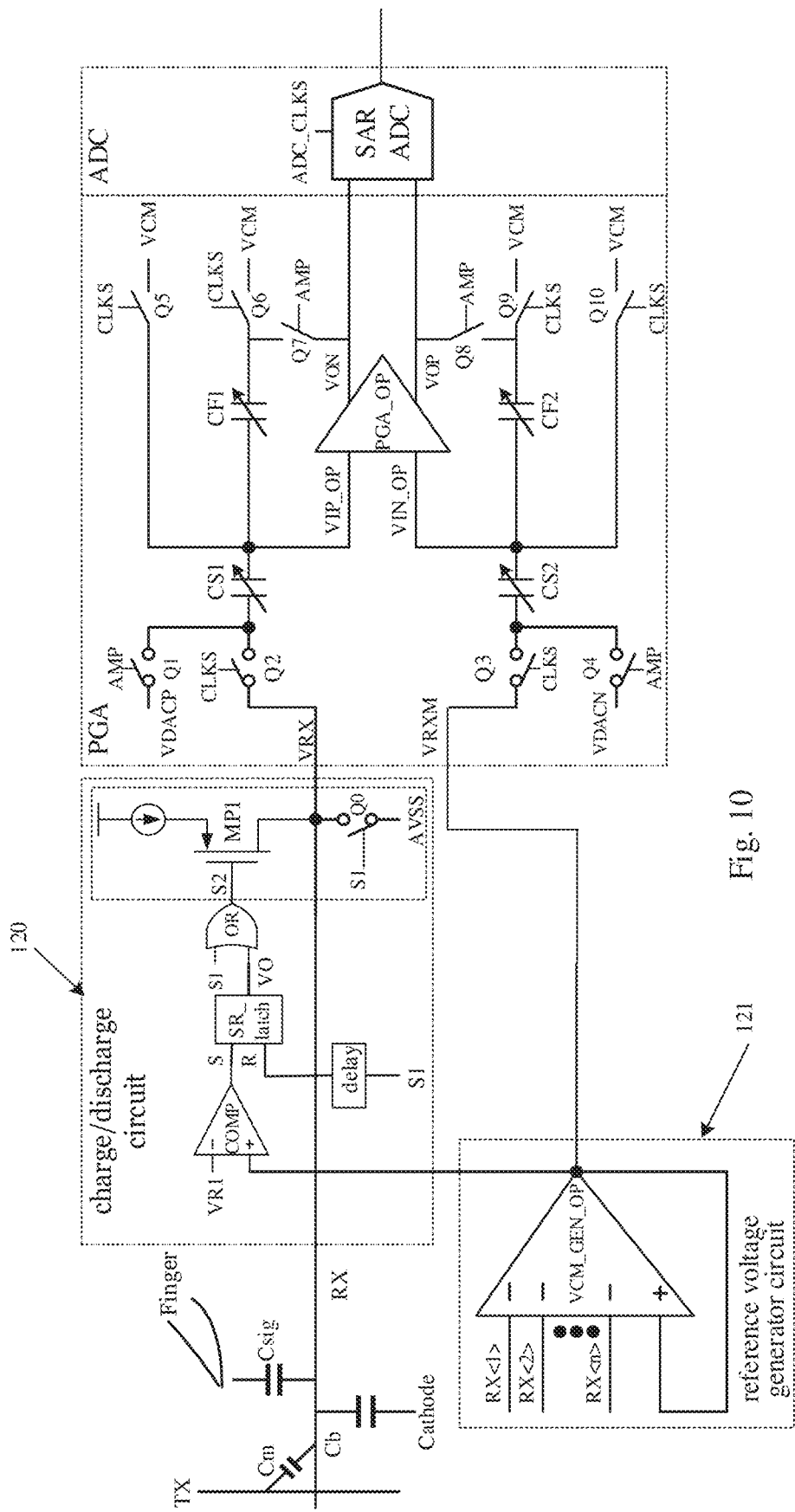
FIG. 10 illustrates a schematic diagram showing an exemplary structure of the touch detection circuit according to the third embodiment of present disclosure.

With combined reference to FIGS. 3, 9 and 10, in a further embodiment of the present disclosure, there is provided a touch detection circuit 12, which is coupled to a touch screen 10 and used to detect capacitance variation in the touch screen 10. A result of detection of the touch detection circuit 12 can be used to determine the location of a touch event occurring on the touch screen 10 and a user's touch operation. The touch detection circuit 12 includes a number of touch detection branches (not labeled in FIG. 3). The touch detection branches may be coupled to respective sense channels RX, or may be each coupled to a plurality of sense channels RX. The touch detection circuit 12 may operate either in a mutual capacitance scan mode or in a self-capacitance scan mode and may include charge/discharge circuits 120 having charge/discharge branches 120a coupled to the sense channels RX.

The touch detection circuit 12 of this embodiment differs from that of the second embodiment in further including a digital-to-analog converter DAC having two differential output terminals coupled to first and second input terminals of programmable gain amplifiers PGA, respectively. The digital-to-analog converter DAC is configured to provide the programmable gain amplifiers PGA with two differential voltages VDACP, VDANC with a difference therebetween, which is adjustable and used to account for non-ideal factors from the previous stage of the programmable gain amplifiers PGA.

It would be appreciated that the digital-to-analog converter DAC may be designed for shared use. In this case, both the digital-to-analog converter DAC and a reference voltage generator circuit 121 are commonly used by the sense channels and the programmable gain amplifiers PGA in the touch detection circuit 12. Of course, it is also possible to provide a digital-to-analog converter DAC for each programmable gain amplifier PGA. Depending on the number of bits of DAC, it can output many voltages (e.g., an 8-bit digital-to-analog converter DAC can provide a total of 256 voltages). DAC may be further coupled to output terminals of ADC and output, based on digital signals from ADC, the two differential voltages VDACP, VDANC desired by PGA. Of course, DAC may be further based on digital signals from other digital circuits to output the two differential voltages VDACP, VDANC desired by PGA.

As an example, referring to FIG. 10, each PGA may include an operational transconductance amplifier PGA_OP, a first input circuit and a second input circuit. The first input circuit includes a first sampling capacitor CS1, a first amplifier switch Q1 and a first sampling switch Q2, and the second input circuit includes a second sampling capacitor CS2, a second amplifier switch Q4 and a second sampling switch Q3.

Optionally, in this example, each PGA may further include a first feedback circuit and a second feedback circuit. The first feedback circuit includes a first feedback capacitor CF1 and a first feedback switch Q7, and the second feedback circuit includes a second feedback capacitor CF2 and a second feedback switch Q8.

Optionally, in this example, each PGA may further include first to fourth reset switches Q5, Q6, Q9 and Q10. A terminal of the first sampling capacitor CS1 is coupled to a terminal of the first feedback capacitor CF1, a terminal of the first reset switch Q5 and a first input terminal VIP_OP of the operational transconductance amplifier PGA_OP. Another terminal of the first sampling capacitor CS1 is coupled to a terminal of the first amplifier switch Q1 and a terminal of the first sampling switch Q2. Another terminal of the first sampling switch Q2 is coupled to an output terminal of the respective charge/discharge branch 120a in order to receive a sense voltage VRX therefrom. Another terminal of the first amplifier switch Q1 is coupled to one differential voltage VDACP output from the digital-to-analog converter DAC. Another terminal of the first feedback capacitor CF1 is coupled to a terminal of the first feedback switch Q7 and a terminal of the second reset switch Q6. Another terminal of the first feedback switch Q7 is coupled to an output terminal VON of the operational transconductance amplifier PGA_OP and an input terminal of the respective analog-to-digital converter ADC.

A terminal of the second sampling capacitor CS2 is coupled to a terminal of the second feedback capacitor CF2, a terminal of the fourth switch Q10 and a second input terminal VIN_OP of the operational transconductance amplifier PGA_OP. Another terminal of the second sampling capacitor CS2 is coupled to a terminal of the second amplifier switch Q4 and a terminal of the second sampling switch Q3. Another terminal of the second sampling switch Q3 is coupled to an output terminal of the reference voltage generator circuit 121 in order to receive a reference voltage VRXM from the reference voltage generator circuit 121. Another terminal of the second amplifier switch Q4 is coupled to the other differential voltage VDACN output from the digital-to-analog converter DAC. Another terminal of the second feedback capacitor CF2 is coupled to a terminal of the second feedback switch Q8 and a terminal of the third switch Q9. Another terminal of the second feedback switch Q8 is coupled to another output terminal VOP of the operational transconductance amplifier PGA_OP and another input terminal of the analog-to-digital converter ADC.

Another terminal of the first reset switch Q5, another terminal of the second reset switch Q6, another terminal of the third reset switch Q9 and another terminal of the fourth reset switch Q10 all receive a common-mode voltage VCM, which is equal to AVDD/2, for example.

Control terminals of Q2, Q3, Q5, Q6, Q9 and Q10 all receive a sampling clock signal CLKS for the respective programmable gain amplifier PGA, and control terminals of Q1, Q4, Q7 and Q8 all receive an amplified phase signal AMP for the programmable gain amplifier PGA. CS1 and CS2 have equal capacitances CS, which are adjustable. CF1 and CF2 have equal capacitances CFB, which are adjustable.

Figure 11:
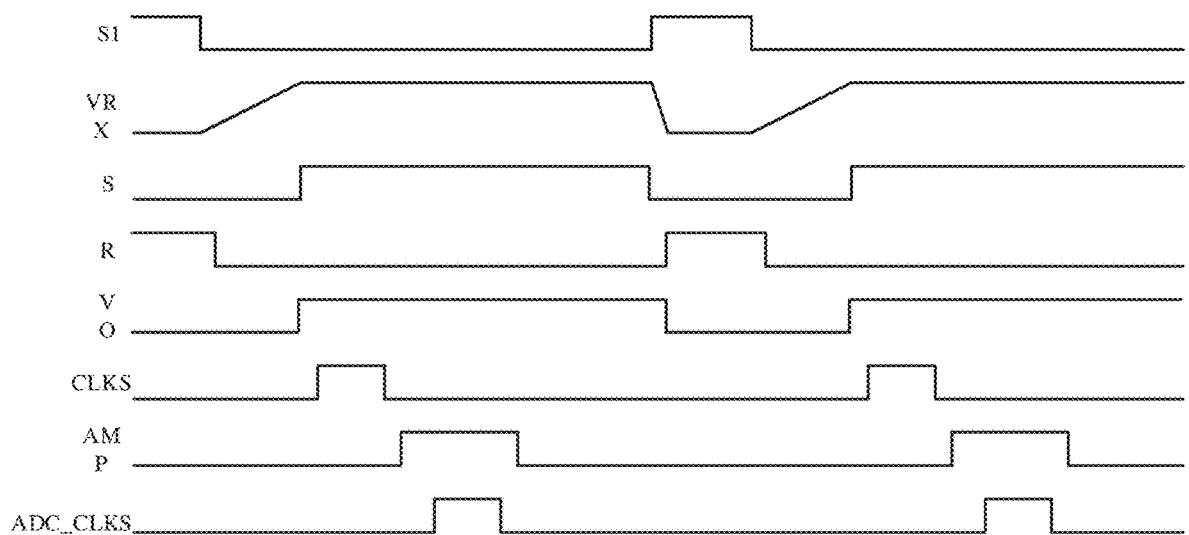
FIG. 11 illustrates a schematic timing diagram showing operation of the third embodiment of present disclosure.

Referring to FIG. 11, operation of the touch detection circuit of this embodiment is timed, for example, as follows:

At the beginning, S1 is high and Q0 is closed, allowing the charge/discharge circuit 120 to discharge the sense channel RX through Q0. As a result, the voltage VRX is pulled down to AVSS. At the same time, S output the comparator COMP is also low, and R output a delay Delay is high.

When S1 transitions low and turns off Q0, R output from the delay Delay transitions low and S2 transitions high, turning on MP1. As a result, the second current source I0 charges the sense channel RX and provides the sense voltage VRX to PGA.

Upon the reference voltage VRXM reaching the reference voltage VR1, S output from the comparator COMP transitions high and S2 transitions low, turning off MP1. As a result, the second current source I0 stops charging the sense channel RX.

Subsequently, the sampling clock signal CLKS for PGA transitions high, closing (turning on) all of Q2, Q3, Q5, Q6, Q9 and Q10. In response, the first sampling capacitor CS1 receives VRX, and the second sampling capacitor CS2 receives VRXM. Thus, PGA samples the voltages VRX and VRXM. For any touched sense channel RX, VRX is lower than VRXM, and for any untouched sense channel RX, VRX is higher than VRXM.

After that, the sampling clock signal CLKS transitions low, turning off all of Q2, Q3, Q5, Q6, Q9 and Q10, and amplifying phase signal AMP transitions high, closing (turning on) Q1, Q4, Q7 and Q8. In response, the first sampling capacitor CS1 receives VDACP, and the second sampling capacitor CS2 receives VDACN. In this way, using the difference between VDACP and VDACN, PGA can mitigate the influence of some non-ideal factors from the previous stage (e.g., Cb inconsistency among the sense channels RX, mismatch of charging currents, etc.) on the sampling results. The obtained result is amplified and provided to ADC for quantization. Based on all the results of detection of the touch detection circuit 12, it can be determined which sense channels are touched and which sense channels are not.

PGA outputs:

$$V_{od} = [(VDACP - VDACN) - (VRX - VRAM)]\frac{CS}{CFB}.$$

From this equation, it can be seen that, through adjusting the difference between VDACP and VDACN, non-ideal factors from the previous stage can be accounted for as much as possible. For example, in order to accommodate the worst channel mismatch cases, a 7-9 bit adjustable differential DAC may be designed for the purpose of this example. Moreover, cooperation of the first input circuit with the first feedback circuit and of the second input circuit with the second feedback circuit enables the PGA output to be dependent on any combination of the difference between VDACP and VDACN, the difference between VRX and VRXM and the capacitance ratio CS/CFB. If the difference VDACP-VDACN is maintained unchanged, the capacitance ratio CS/CFB, and hence a gain coefficient of the operational transconductance amplifier PGA_OP, may be adjusted and controlled to expand a dynamic range of the programmable gain amplifier PGA and result in higher touch detection accuracy.

Referring to FIG. 3, in this embodiment, there is also provided a touch sensing chip including the touch detection circuit 12 of this embodiment.

Referring to FIG. 3, in this embodiment, there is also provided an electronic device including the touch screen 10 and the touch sensing chip of this embodiment.

The touch sensing chip and the electronic device both have improved performance because of the touch detection circuit of this embodiment incorporated therein.

In summary, the touch detection circuit, touch sensing chip and electronic device of this embodiment have better overall performance than those of the second embodiment.

The description presented above is merely that of a few preferred embodiments of the present disclosure and is not intended to limit the scope thereof in any sense. Any and all changes and modifications made by those of ordinary skill in the art based on the above teachings fall within the scope as defined in the appended claims.

What is claimed is:

1. A touch detection circuit, comprising: charge/discharge circuits, which are coupled to respective sense channels of a touch screen and are configured to charge or discharge the sense channels during scanning periods to convert sense signals on the sense channels into sense voltages; a reference voltage generator circuit, which is coupled to the sense channels of the touch screen and is configured to produce a reference voltage related to the voltages on one or more of the sense channels; programmable gain amplifiers comprising first input terminals coupled to output terminals of the charge/discharge circuits and second input terminals coupled to an output terminal of the reference voltage generator circuit, the programmable gain amplifiers configured to amplify differences between the sense voltages and the reference voltage; analog-to-digital converters, which are coupled to the programmable gain amplifiers and are configured for quantization of the differences that have been amplified by the programmable gain amplifiers; and wherein the reference voltage generator circuit comprises an operational amplifier with a first input terminal and a plurality of second input terminals, each of the second input terminals of the operational amplifier coupled to a respective one of the sense channels, the first input terminal of the operational amplifier coupled to an output terminal of the operational amplifier, the operational amplifier configured to output an average of the voltages on the sense channels as the reference voltage.

2. The touch detection circuit of claim 1, wherein there are n sense channels, where n is an integer satisfying n>=2, and wherein the operational amplifier comprises one first input transistor, n identical second input transistors and an operational amplifier circuit, a gate of the first input transistor coupled to an output terminal of the operational amplifier circuit, a drain of the first input transistor coupled to a first input terminal of the operational amplifier circuit, a source of the first input transistor and sources of the n second input transistors all coupled to a first current source, drains of the n second input transistors all coupled to a second input terminal of the operational amplifier circuit, gates of the n second input transistors coupled to the respective n sense channels.

3. The touch detection circuit of claim 1, wherein each charge/discharge circuit comprises a charge/discharge branch comprising a first switch, a second switch and a second current source, a control terminal of the first switch configured to receive a first control signal, a control terminal of the second switch configured to receive a second control signal that is different from the first control signal, and wherein:

in a mutual capacitance scan mode, a terminal of the second current source is coupled to a first power supply voltage, another terminal of the second current source is coupled to a terminal of the second switch, another terminal of the second switch is coupled to a terminal of the first switch, the respective sense channel and the first input terminal of the respective programmable gain amplifier, and another terminal of the first switch is coupled to a common reference voltage; or in a self-capacitance scan mode, a terminal of the second current source is coupled to a second power supply voltage, another terminal of the second current source is coupled to a terminal of the second switch, another terminal of the second switch is coupled to a terminal of the first switch, the respective sense channel and the first input terminal of the respective programmable gain amplifier, and another terminal of the first switch is coupled to the first power supply voltage.

4. The touch detection circuit of claim 3, wherein the output terminal of the reference voltage generator circuit is coupled to the control terminals of the second switches, and the reference voltage generator circuit is configured to control the charge/discharge circuits to charge or discharge the sense channels by using the reference voltage.

5. The touch detection circuit of claim 4, wherein each charge/discharge circuit further comprises an OR logic circuit and a comparator, the comparator comprising a second input terminal coupled to a reference voltage, the comparator comprising a first input terminal coupled to the output terminal of the reference voltage generator circuit, the comparator comprising an output terminal coupled to a first input terminal of the OR logic circuit, a second input terminal of the OR logic circuit configured to receive the first control signal, an output terminal of the OR logic circuit configured to output the second control signal.

6. The touch detection circuit of claim 5, wherein each charge/discharge circuit further comprises a flip-flop and a delay, the flip-flop comprising a first input terminal coupled to the output terminal of the comparator, the flip-flop comprising a second input terminal coupled to an output terminal of the delay, the flip-flop comprising an output terminal coupled to the first input terminal of the OR logic circuit, the delay configured to delay the first control signal and then provide the delayed first control signal to the flip-flop.

7. The touch detection circuit of claim 1, further comprising a digital-to-analog converter comprising two differential output terminals coupled respectively to the first and second input terminals of the programmable gain amplifiers, the digital-to-analog converter configured to provide the programmable gain amplifiers with two differential voltages with a difference therebetween, which is adjustable and used to account for non-ideal factors of a previous stage of the programmable gain amplifiers.

8. The touch detection circuit of claim 7, wherein each programmable gain amplifier comprises an operational transconductance amplifier, a first input circuit and a second input circuit, a terminal of the first input circuit serving as the first input terminal of the programmable gain amplifier and coupled to one of the differential output terminals of the digital-to-analog converter and the output terminal of the respective charge/discharge circuit to access one of the differential voltages and the respective sense voltage, another terminal of the first input circuit coupled to a first input terminal of the operational transconductance amplifier, a terminal of the second input circuit serving as the second input terminal of the programmable gain amplifier and coupled to the other of the differential output terminals of the digital-to-analog converter and the output terminal of the reference voltage generator circuit to access the other of the differential voltages and the reference voltage, another terminal of the second input circuit coupled to a second input terminal of the operational transconductance amplifier, an output terminal of the operational transconductance amplifier coupled to the respective analog-to-digital converter.

9. The touch detection circuit of claim 8, wherein the first input circuit comprises a first sampling capacitor, a first amplifier switch and a first sampling switch, a terminal of the first sampling capacitor coupled to the first input terminal of the operational transconductance amplifier, another terminal of the first sampling capacitor coupled to a terminal of the first amplifier switch and a terminal of the first sampling switch, another terminal of the first sampling switch coupled to the output terminal of the respective charge/discharge circuit, another terminal of the first amplifier switch coupled to one of the differential output terminals of the digital-to-analog converter; or the second input circuit comprises a second sampling capacitor, a second amplifier switch and a second sampling switch, a terminal of the second sampling capacitor coupled to the second input terminal of the operational transconductance amplifier, another terminal of the second sampling capacitor coupled to a terminal of the second amplifier switch and a terminal of the second sampling switch, another terminal of the second sampling switch coupled to the output terminal of the reference voltage generator circuit, another terminal of the second amplifier switch coupled to the other of the differential output terminals of the digital-to-analog converter, and wherein both the first and second amplifier switches are turned on during an amplifying phase of the programmable gain amplifier, and both the first and second sampling switches are turned on during a sampling phase of the programmable gain amplifier.

10. The touch detection circuit of claim 8, wherein each programmable gain amplifier further comprises a first feedback circuit and a second feedback circuit, a terminal of the first feedback circuit coupled to the output terminal of the operational transconductance amplifier, another terminal of the first feedback circuit coupled to the first input terminal of the operational transconductance amplifier, a terminal of the second feedback circuit coupled to the output terminal of the operational transconductance amplifier, another terminal of the second feedback circuit coupled to the second input terminal of the operational transconductance amplifier.

11. The touch detection circuit of claim 10, wherein:
the first feedback circuit comprises a first feedback capacitor and a first feedback switch, a terminal of the first feedback capacitor coupled to the first sampling capacitor and the first input terminal of the operational transconductance amplifier, another terminal of the first feedback capacitor coupled to a terminal of the first feedback switch, another terminal of the first feedback switch coupled to the output terminal of the operational transconductance amplifier; or
the second feedback circuit comprises a second feedback capacitor and a second feedback switch, a terminal of the second feedback capacitor coupled to the second input terminal of the operational transconductance amplifier, another terminal of the second feedback capacitor coupled to a terminal of the second feedback switch, another terminal of the second feedback switch coupled to the output terminal of the operational transconductance amplifier, and wherein both the first and second amplifier switches are turned on during an amplifying phase of the programmable gain amplifier.

12. The touch detection circuit of claim 10, wherein each programmable gain amplifier further comprises first to fourth reset switches, a terminal of each of the first to fourth reset switches coupled to the common reference voltage, another terminal of the first reset switch coupled to the first input terminal of the operational transconductance amplifier, another terminal of the second reset switch coupled to a node at which the first feedback capacitor is coupled to the first feedback switch, another terminal of the third reset switch coupled to a node at which the second feedback capacitor is coupled to the second feedback switch, another terminal of the fourth reset switch coupled to the second input terminal of the operational transconductance amplifier, and wherein the first to fourth reset switches are all turned on during a sampling phase of the programmable gain amplifier.

13. The touch detection circuit of claim 7, wherein at least the digital-to-analog converter or the reference voltage generator circuit are commonly shared by the sense channels.

14. A touch sensing chip comprising the touch detection circuit of claim 1.

15. An electronic device comprising a touch screen and the touch sensing chip of claim 14, the touch screen comprising at least two sense channels, wherein the touch sensing chip is coupled to each of the sense channels.

* * * * *